United States Patent

[11] 3,614,548

[72] Inventor Morio Inoue
Takatsuki, Japan

[21] Appl. No. 45,332
[22] Filed June 11, 1970
[45] Patented Oct. 19, 1971

[73] Assignee Matsushita Electronics Corporation
Osaka, Japan

[32] Priority June 18, 1969
[33] Japan
[31] 44/49150

[54] SEMICONDUCTOR DEVICE HAVING A $TiO_2$-$SiO_2$ COMPOSITE OXIDE LAYER
4 Claims, 2 Drawing Figs.

[52] U.S. Cl. .......... 317/234, 317/238, 29/576
[51] Int. Cl. .......... H01l 3/00
[50] Field of Search .......... 317/238, 234; 29/576

[56] References Cited

UNITED STATES PATENTS

| | | | |
|---|---|---|---|
| 3,339,086 | 8/1967 | Shackley | 317/235 X |
| 3,373,051 | 3/1968 | Li Chu et al. | 317/235 X |
| 3,428,875 | 2/1969 | Snow | 317/235 |
| 3,470,609 | 10/1969 | Breitweiser | 29/571 |

*Primary Examiner*—James D. Kallam
*Attorney*—Stevens, Davis, Miller & Mosher

ABSTRACT: A surface protective layer or surface insulating layer of a composite oxide which is formed of silicon dioxide ($SiO_2$) to which is added with less than 0.02 percent by weight of titanium dioxide ($TiO_2$) stabilizes and improves the characteristics of the semiconductor device of a single layer formed of silicon oxide. The above-mentioned semiconductor device is provided by mixing small amount of gaseous organic compounds of titanium such as triisopropyl titanate with a gaseous organic compound of silicon such as tetraethoxysilane and leading the resultant gaseous mixture onto a predetermined semiconductor substrate which is heated and held at a temperature of from 300° to 500° C. to react therewith.

INVENTOR
MORIO INOUE

BY Stevens, Davis, Miller & Mosher
ATTORNEYS

SEMICONDUCTOR DEVICE HAVING A $TiO_2$-$SiO_2$ COMPOSITE OXIDE LAYER

This invention relates to a semiconductor device having an insulating layer on the surface of the substrate, particularly to an improvement in the insulating layer.

A layer of silicon dioxide formed under a low temperature has often been used as a surface protecting layer and an impurity diffusion preventing layer (mask) of a semiconductor element with a silicon or germanium substrate, or an insulating layer of a field effect type element. Usually, such a silicon dioxide layer is formed on the surface of the substrate by thermally decomposing an organic compound of silicon such as ethyl silicate at a temperature of from 300° to 800° C., that is, by what is called the method of low-temperature chemical vapor growth. However, owing to the low temperature, the silicon layer formed according to this method is remarkably inferior in such properties as density, insulation and moisture-resistance as compared with the well-known thermal oxidation layer, that is, the layer of silicon dioxide which is formed by treating a substrate silicon at high temperature in an oxidizing atmosphere. Therefore, the silicon dioxide layer formed by the method of low-temperature vapor growth can hardly be used for a semiconductor device which requires high reliability. On the other hand, a layer of titanium dioxide ($TiO_2$) has been formed by the method similar to that of chemical low temperature forming of the layer of silicon oxide, and many attempts to utilize the titanium dioxide layer alone or in conjunction with the silicon dioxide layer for the semicondutor device have been made. However, an insulating layer including a comparatively large amount of titanium dioxide has the following disadvantages: (1) insufficiency as to its insulating property, (2) too large a dielectric constant, (3) nonsmoothness of chemical etching, and in particular, difficulty in carrying out highly accurate etching work by photolithographic etching technique, (4) irregular changes in the characteristics of the insulating layer resulting from the complicated reaction between both the oxides of silicon and titanium during the high-temperature treatment process, and (6) the occurrence of uncertain changes in the electric characteristics of the semiconductor owing to electric charges moving in the layer upon the application of electric voltage, and therefore, the layer has problems which have not been solved yet in practice.

The inventtor has found that, when titanium oxide is added into a silicon oxide layer which is formed by a low temperature process from an organic compound of silicon, an insulating layer of excellent electric characteristics is obtained with the amount of added titanium oxide made lower than 0.02 percent by weight, and that a semiconductor device including the above-mentioned insulating layer has excellent stability.

That is, the semiconductor device according to this invention is provided by mixing a small amount of gaseous organic compound of titanium such as triisopropyl titanate with a gaseous organic compound of silicon such as tetraethoxysilane and leading the mixed reaction gas onto a predetermined semiconductor substrate which is heated and held at a temperature of from 300° to 500° C. to react therewith. This semiconductor device comprising the composite layer added with layer added with less than 0.02 percent by weight, in particular, 0.005 to 0.02 percent by weight of titanium oxide is much more excellent than that comprising a layer of pure silicon oxide alone.

The above and other features and advantages of this invention will be apparent from the following detailed description taken in conjunction with the accompanying drawings, in which:

FIG. 1 illustrates a capacitor element having a MOS structure; and

FIG. 2 illustrates a planar diode element.

Now, the devices according to this invention will be described in detail with respect to the embodiments.

EMBODIMENT 1

Figure 1:
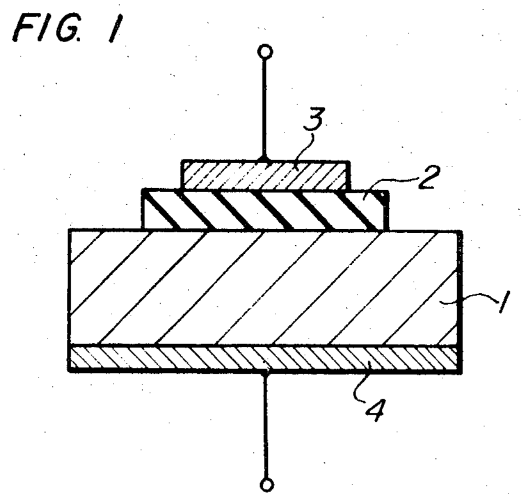
FIGS. 1 and 2 are both cross-sectional views showing embodiments of this invention.

In order to manufacture the capacitor element of a MOS structure as shown in FIG. 1, firstly, a mixture of tetraethoxysilane of purity 99.999 percent and triisopropyltitanate of purity 99.9 percent added in a weight ratio of about 0.01 percent is prepared, next, the mixed liquids are heated and held at a temperature of 70° C. to be vaporized, and finally nitrogen gas (carrier gas) is blown into the resulting vapor at the rate of one liter per minute to provide a gaseous mixture. Then, the gaseous mixture is led onto a P-type silicon substrate 1 having a specific resistance of 2Ω–cm. which is heated and held at a temperature of 400° C. so as to become thermally decomposed. When oxygen gas is added to the gaseous mixture in this thermal decomposition stage, the process of thermal decomposition-insulating layer formation is enhanced, that is, 1 liter is blown in per minute and the layer formation is made during 20 minutes so that a composite oxide layer 2, 0.4$\mu$ thick may be obtained in this embodiment. A circular aluminium layer 3, 1 mm. in diameter is evaporated on the oxide layer 2 to form an electrode, and further, various characteristics are measured between the electrode above and an electrode 4 on the other surface of the semiconductor substrate. In order to compare the effect of the device according to this invention with those of other processes, a MOS structure type capacitor elements of the same size were fabricated by the following two processes.

a. An oxide layer was formed of a tetraethoxysilane of purity 99.999 percent by the similar process to that of this embodiment.

b. An oxide layer was formed by a similar process as that of this embodiment, of tetraethoxysilane of purity 99.999 percent added with triisopropyltitanate of 99.9 percent purity in weight ratio of 10 percent.

The characteristics of the devices fabricated by the abovementioned processes are shown in the following table for comparison.

| Characteristics | This embodiment | Device of process (a) | Device of process (b) |
|---|---|---|---|
| $N_{FB}$ initial value | $5\sim10\times10^{11}$ | $30\sim80\times10^{11}$ | $20\sim40\times10^{11}$ |
| Change in $N_{FB}$ after (+) BTT | $\oplus5\sim10\times10^{11}$ | $\oplus50\sim80\times10^{11}$ | $30\sim50\times10^{11}$ |
| Change in $N_{FB}$ after (−) BTT | $\ominus1\sim5\times10^{11}$ | $\ominus10\sim30\times10^{11}$ | $\ominus0.5\sim1\times10^{11}$ |
| Leakage current | Small | Small | Large. |
| Smoothness in of etching | Good | Good | Not good. |
| Dielectric constant | 4.2 | 4.0 | 7. |

where, $N_{FB}$: the flat-band density of electrons.

BTT: the method of bias-temperature treatment, and (+), (−) are respectively the directions of the bias voltage, $\oplus$. $\ominus$ represent respectively the increases and the decreases.

In addition, regarding $N_{FB}$, the smaller is its value the better, and regarding the change in $N_{FB}$ after BTT treatment, the smaller its value the better will be the efficiency. As is apparent from the characteristics shown in this table, the device according to this invention is generally more excellent than other devices in this field.

EMBODIMENT 2

Tributyltitanate and triethyltitanate instead of triisopropyltitanate in the manufacturing process of the embodiment 1 are employed with various amounts of addition ranging from 0.005 to 0.02 percent by weight, and the resulting layers are similar in their characteristics to those obtained in the embodiment 1.

Figure 2:
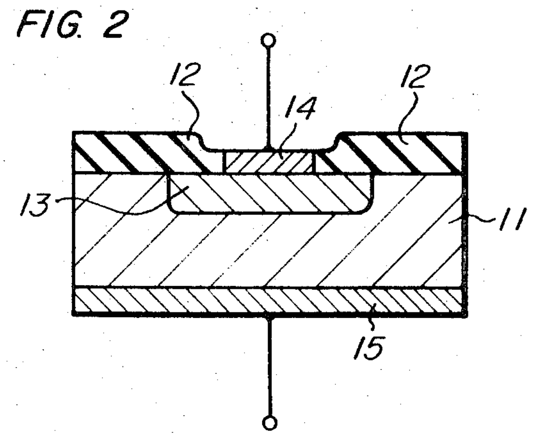

In order to manufacture a diode element of a planar structure as shown in FIG. 2, first, a composite oxide layer 12 consisting mainly of silicon dioxide with titanium dioxide added in the ratio of about 0.01 percent by weight is deposited on the surface of a semiconductor substrate 11 of an N-type, such as silicon, for example, by the process as described in the embodiment 1, next, a predetermined window for diffusion is provided on the resulting layer so that boron may be diffused

EMBODIMENT 3 and led thereinto to form a doping region 13, and further, metal electrode layers 14 and 15 are provided so as to form a diode. In addition, the layer 12' is a silicon dioxide layer which is grown as a result of oxidation of the substrate in the process of boron diffusion, and is a passivation layer just as the mixture oxide layer 12.

The composite oxide layer as employed in this embodiment is not only satisfactorily effective in its masking action, but also practicable as a passivation layer.

As described above, the devices according to this invention are considerably enhanced in their stability as a result of providing on the surface of the semiconductor substrate a composite oxide layer consisting of silicon dioxide as a main material with a small amount of titanium dioxide added in a ratio of less than 0.02 percent by weight, and the method of manufacturing them is readily realizable and is useful in practice.

I claim:

1. A semiconductor device comprising a semiconductor substrate having a protective composite oxide layer on the surface thereof, said layer comprising silicon dioxide containing titanium dioxide in a portion of no more than 0.02 percent by weight.

2. A semiconductor device comprising a semiconductor substrate having a composite oxide layer comprising titanium dioxide and silicon dioxide on the surface thereof, the titanium dioxide being in a range of 0.005 percent to 0.05 percent by weight of the layer.

3. A method of manufacturing a semiconductor substrate having a $TiO_2$-$SiO_2$ composite layer on the surface with the $TiO_2$ being less than 0.02 percent by weight of the layer, said method comprising mixing a gaseous organic compound of silicon and a gaseous organic compound of titanium with the organic compound of titanium being no more than 0.02 percent of the mixture by weight, and applying the gaseous mixture to a surface of said semiconductor substrate while maintaining the substrate at a temperature of from 300° to 500° C.

4. A method of manufacturing a semiconductor device as claimed in claim 7, in which tetraethoxysilane and triisopropyltitanate are the organic compound of silicon and the organic compound of titanium, respectively.